(12) United States Patent
Chu et al.

(10) Patent No.: US 7,084,431 B2
(45) Date of Patent: *Aug. 1, 2006

(54) HIGH SPEED COMPOSITE P-CHANNEL SI/SIGE HETEROSTRUCTURE FOR FIELD EFFECT DEVICES

(75) Inventors: Jack Oon Chu, Manhasset Hills, NY (US); Richard Hammond, Dobbs Ferry, NY (US); Khalid EzzEldin Ismail, Yorktown Heights, NY (US); Steven John Koester, Ossining, NY (US); Patricia May Mooney, Mt. Kisco, NY (US); John A. Ott, Greenwood Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

This patent is subject to a terminal disclaimer.

(21) Appl. No.: 10/832,217

(22) Filed: Apr. 26, 2004

(65) Prior Publication Data
US 2004/0227154 A1    Nov. 18, 2004

Related U.S. Application Data

(62) Division of application No. 09/989,770, filed on Nov. 20, 2001, now Pat. No. 6,858,502, which is a division of application No. 09/267,323, filed on Mar. 12, 1999, now Pat. No. 6,350,993.

(51) Int. Cl.
H01L 27/15    (2006.01)
H01L 29/06    (2006.01)

(52) U.S. Cl. .......................................... 257/79; 257/19

(58) Field of Classification Search ................... None
See application file for complete search history.

(56) References Cited

U.S. PATENT DOCUMENTS 5,534,713 A * 7/1996 Ismail et al. .................. 257/24

* cited by examiner

Primary Examiner—Zandra V. Smith
Assistant Examiner—Kiesha Rose
(74) Attorney, Agent, or Firm—Scully, Scott, Murphy & Presser, P.C.; Robert M. Trepp, Esq.

(57) ABSTRACT

A layered structure for forming electronic devices thereon is provided. The layered structure includes an over-shoot layer, $Si_{1-y}Ge_y$, within a relaxed $Si_{1-x}Ge_x$ layer, wherein $y=X+Z$ and Z is in the range from 0.01 to 0.1 and X is from 0.35 to 0.5. The over-shoot layer has a thickness that is less than its critical thickness.

15 Claims, 13 Drawing Sheets

HIGH SPEED COMPOSITE P-CHANNEL SI/SIGE HETEROSTRUCTURE FOR FIELD EFFECT DEVICES

RELATED APPLICATIONS

This application is a divisional application of U.S. application Ser. No. 09/989,770, filed Nov. 20, 2001 now U.S. Pat. No. 6,858,502, which is a divisional application of U.S. application Ser. No. 09/267,323 filed Mar. 12, 1999, now U.S. Pat. No. 6,350,993.

FIELD OF THE INVENTION

This invention relates to a silicon and silicon germanium based materials system and more specifically, to a novel epitaxial field effect transistor structure capable of high-speed low-noise, microwave, submillimeter-wave and millimeter-wave applications. Preferably, the epitaxial field effect transistor structure includes a high performance strained p-channel incorporating silicon, germanium, and silicon germanium layers to form a modulation-doped heterostructure.

BACKGROUND OF THE INVENTION

In high speed and low noise device applications, the focus has been on designing and fabricating high electron mobility transistors (HEMTs) or modulation-doped field effect transistors (MODFETs) where carrier (eg. electrons, holes) conduction occurs in an undoped channel layer such that the carrier mobility is not limited by impurity scattering and high carrier mobility is achieved. In general, these high speed electronic devices are often used as low-noise amplifiers, power amplifiers, satellite receivers and transmitters operating in the microwave and rf regime, and the material of choice is usually the faster but more expensive III–V (e.g. GaAs) materials system and technology. A complicated and costly III–V materials technology is not very desirable in the semiconductor industry whereas a less-expensive SiGe materials system which is fully compatible with present Si technology is more desirable and far easier to integrate with existing Si-CMOS device technology.

One example of a material system compatible with Si technology is described in U.S. Pat. No. 5,019,882 which issued on May 28, 1991 to P. M. Solomon entitled "Germanium Channel Silicon MOSFET" and assigned to the assignee herein. In U.S. Pat. No. 5,019,882, a channel having improved carrier mobility comprises an alloy layer of silicon and germanium which is grown above a silicon substrate. The alloy layer is kept thin enough for proper pseudomorphic dislocation free growth. A layer of silicon is formed over the alloy layer and is oxidized partially through to form a dielectric layer. A gate region is formed over the silicon dioxide.

A second example of a high performance SiGe device structure compatible with Si technology, is described in U.S. Pat. No. 5,534,713 which issued on Jul. 9, 1996 to K. E. Ismail entitled "Complementary Metal-Oxide Semiconductor Transistor Logic Using Strained Si/SiGe Heterostructure Layers" and assigned to the assignee herein. In U.S. Pat. No. 5,534,713 a silicon CMOS transistor structure is described utilizing a buried SiGe channel under compressive strain with enhanced hole mobility for a p-channel device, and a buried Si channel under tensile strain with enhanced electron mobility for an n-channel device fabricated on a strained Si/SiGe heterostructure design. Further in U.S. Pat. No. 5,534,713 the proposed compressively-strained SiGe layer serving as a p-channel for the p-channel field effect transistor is described as having a composition of germanium in the range from 50 to 100% and with a preferred composition of 80%. Thus far, prototype SiGe p-channel MODFETs utilizing this channel design and composition at the IBM Corporation have yielded hole mobilities only up to 1,000 cm$^2$/Vs at room temperature. Consequently, in order to achieve an even higher hole mobility of greater than 1,000 cm$^2$/Vs, a p-channel design with a composite or dual layer structure composed of a Ge layer (of 15–20 Å thick) together with a SiGe layer of 70–80% Ge (of 70–100 Å thick) is presented as the optimum p-channel structure to produce a higher hole mobility in a SiGe materials system.

SUMMARY OF THE INVENTION

In accordance with the present invention, a silicon and silicon germanium based epitaxial structure for a p-type field-effect transistor that utilizes a composite or a dual layer structure of substantially pure Ge and a SiGe layer in a p-channel region is described for forming a p-channel device comprising a semiconductor substrate, a first layer of relaxed $Si_{1-x}Ge_x$ formed epitaxially on the substrate where the Ge fraction x is in the range from 0.35 to 0.5, a second layer of p doped $Si_{1-x}Ge_x$ formed epitaxially on the first layer, a third layer of undoped Si formed epitaxially on the second layer whereby the Si layer is under tensile strain and remains commensurate with respect to the top of the first relaxed $Si_{1-x}Ge_x$ layer, a fourth layer of undoped $Si_{1-x}Ge_x$ formed epitaxially on the third layer, a fifth layer of undoped Ge formed expitaxially on the fourth layer whereby the Ge layer is under compressive strain and remains commensurate with respect to the top of the first relaxed $Si_{1-w}Ge_w$ layer, a sixth layer of undoped $Si_{1-y}Ge_y$ formed epitaxially on the fifth layer where the Ge fraction w is in the range from 0.5 to less than 1.00 and where w−x>0.2 whereby the $Si_{1-w}Ge_w$ layer is under compressive strain, and a seventh layer of undoped $Si_{1-x}Ge_x$ formed epitaxially on the fifth layer. A metal layer alone to form a Schottky barrier or a dielectric and metal layer may be formed and patterned over the seventh layer to form the gate of the p-channel field effect transistor while the drain and source regions may be formed by forming p regions on either side of the gate in the layered structure. This layered structure design forms a modulation-doped heterostructure whereby the supply layer or the second p-doped $Si_{1-x}Ge_x$ layer is located below the active composite channel of layers of five and six. Furthermore, in this layered device structure, the spacer layer which separate the active channel from the supply layer employs a dual layer comprising the third layer of undoped Si and the fourth layer of undoped $Si_{1-x}Ge_x$.

The invention further provides a method for forming and a p-channel field effect transistor having increased hole mobility in its channel comprising a semiconductor substrate, a first layer of relaxed $Si_{1-x}Ge_x$ formed epitaxially on the substrate where x is in the range from 0.35 to 0.5, a second layer of p doped $Si_{1-x}Ge_x$ formed epitaxially on the first layer, a third layer of undoped $Si_{1-x}Ge_x$ formed epitaxially on the second layer, a fourth layer of undoped Ge formed epitaxially on the third layer whereby the Ge layer is commensurate with respect to the top of the first relaxed $Si_{1-w}Ge_w$ layer, a fifth layer of undoped $Si_{1-y}Ge_y$ formed epitaxially on the fourth layer where the Ge fraction w is in the range from 0.5 to less than 1.00 and the fifth $Si_{1-w}Ge_w$ layer is under compressive strain, and a sixth layer of undoped $Si_{1-x}Ge_x$ formed epitaxially on the fifth layer. This layered structure design describes a modulation-doped heterostructure whereby the supply layer or p-doped $Si_{1-x}Ge_x$ second layer is separated from the active composite channel in the fourth and fifth layers by a single spacer third layer design of Si or $Si_{1-x}Ge_x$.

The invention further provides a method and a p-channel field effect transistor having increased hole mobility in its channel comprising a semiconductor substrate, a first layer of relaxed $Si_{1-x}Ge_x$ formed epitaxially on the substrate where x is in the range from 0.35 to 0.5, a second layer of undoped Ge formed epitaxially on the top of the first layer whereby the Ge layer is commensurate with respect to the top of the first relaxed $Si_{1-x}Ge_x$ layer, a third layer of undoped $Si_{1-w}Ge_w$ formed epitaxially on the second layer where the Ge fraction w is in the range from 0.5 to less than 1.00 and the third $Si_{1-w}Ge_w$ layer is under compressive strain, a fourth layer of undoped $Si_{1-x}Ge_x$ formed epitaxially on the third layer, and a fifth layer of p-doped $Si_{1-x}Ge_x$ formed epitaxially on the fourth layer. This layered structure design describes a modulation-doped heterostructure whereby the supply layer or the fifth layer of p-doped $Si_{1-x}Ge_x$ is located above the active composite channel comprising the second and third layer. Likewise, the supply layer or the fifth layer of p-doped $Si_{1-x}Ge_x$ can be further separated above the active composite channel of the second and third layer with the addition of a Si spacer layer between the third and fourth layer, or alternatively between the fourth and fifth layer.

The invention further provides a method and a structure for a relaxed (greater than 90%) $Si_{1-x}Ge_x$ buffer layer comprising a semiconductor substrate, a first layer of partially relaxed (less than 50%) $Si_{1-x}Ge_x$ formed epitaxially by stepwise grading (or linear grading) where the Ge content of the layers is increased in a stepwise fashion (or in a linear fashion) starting on a substrate and x is in the range of 0.1 to 0.9, a second layer of $Si_{1-y}Ge_y$ formed epitaxially on the first layer where y=x+z and z is in the range from 0.01 to 0.1 which serves to "over relax" the second layer to an equivalent composition and having a lattice spacing corresponding to a composition greater than x, and a third layer of $Si_{1-x}Ge_x$ formed epitaxially on the second layer whereby $Si_{1-x}Ge_x$ layer is now more relaxed as compared to the original, partially relaxed $Si_{1-x}Ge_x$ first layer. The extent of additional relaxation due to this "over shoot" second layer of $Si_{1-y}Ge_y$ does depend on the thickness of this second layer which in turn is limited by its critical thickness on the initial partially relaxed $Si_{1-x}Ge_x$ first layer.

The invention further provides a p-type field-effect transistor can be fabricated on one of the previously described layer structures where the conducting channel of the device is composed of a composite or dual layer structure comprising a substantially pure Ge layer and a SiGe layer. The field-effect transistor is isolated by regions created by selectively removing the top barrier layer, the conducting dual layer channel, the undoped spacer regions and the p-type doping region such that a two-dimensional channel is formed only within an isolated active device region. A gate electrode consisting of a conducting stripe may be formed directly on the wafer surface above the active device region, and source and drain electrodes may be formed by making Ohmic contact to the conducting dual layer channel on either side of the gate electrode within the active device region.

It is an object of this invention to provide a p-type modulation-doped field-effect transistor (MODFET) that is fabricated on a composite or dual-layer structure comprising substantially pure Ge layer and a SiGe layer.

It is an object of the invention to provide a layered structure which allows for p-channel field effect transistors to be formed having a channel with a unique composition profile as a function of depth.

It is a further object of the invention to provide a p-channel device where the active channel is a composite or dual layer structure composed of a thin Ge layer together with a SiGe layer.

It is a further object of the invention to provide p-channel devices where the composite channel structure takes advantage of the higher compressive strain with the benefits of higher carrier mobility and a higher barrier or a deeper confining channel for hole carriers as compared to a channel with a single SiGe layer.

It is a further object of the invention to provide a buried composite channel of a Ge layer with a SiGe layer under compressive strain for higher carrier mobility in a p-channel device.

It is a further object of the invention to provide a p-channel device where the spacer layer is a composite or dual layer design composed of a thin Si layer together with a SiGe layer.

It is a further object of the invention to provide a layered structure and process for making where a desired relaxed SiGe layer can be more fully relaxed by the addition of one or more over shoot layers in the grade-up composition of the SiGe buffer structure.

It is a further object of the invention to provide a p-MODFET with higher hole mobility compared to the prior art, such as bulk Si p-MOSFETs and single-channel SiGe p-MODFETs.

It is a further object of the invention to provide a p-MODFET with enhanced high-frequency operation compared to bulk Si p-MOSFETs or compared to single-channel SiGe p-MODFETs due to higher carrier mobility.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
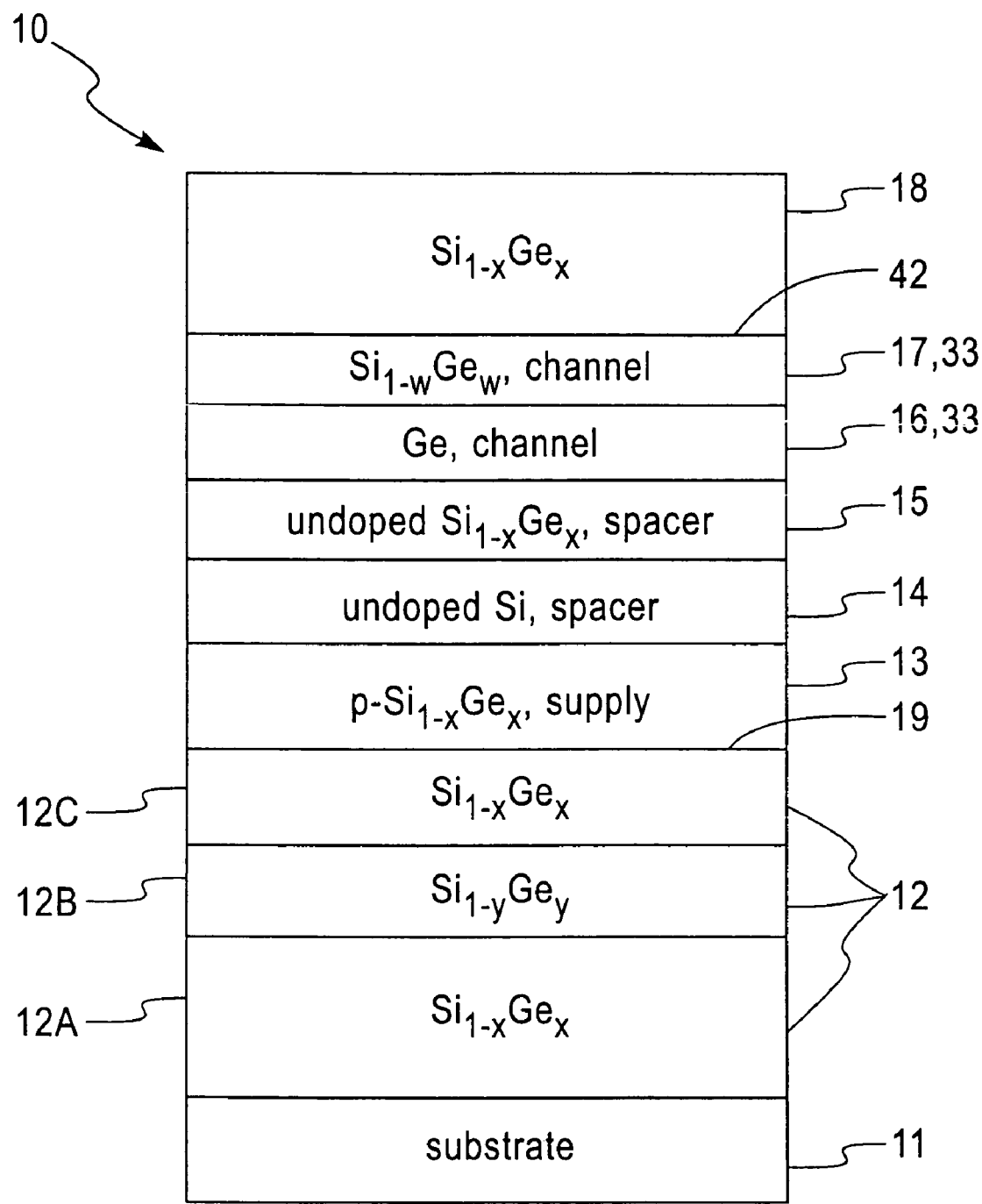
FIG. 1 is a cross section view of a layered structure illustrating one embodiment of the invention.

Referring to the drawing, and in particular to FIG. 1, a cross section view of a layered structure 10 for a composite p-channel modulation-doped SiGe heterostructure is shown to illustrate the embodiment of the invention. Layers 12–18 are epitaxially grown on a single crystal semiconductor substrate 11 which may be Si, SiGe, Ge, SiC, GaAs, SOS, SOI, Bond and Etch back Silicon On Insulator (BESOI), etc. using an epitaxial growth technique such as ultra high vacuum chemical vapor depositon (UHV-CVD), molecular beam epitaxy (MBE), or rapid thermal chemical vapor deposition (RTCVD). For a description of UHV-CVD methods for growing epitaxial Si and $Si_{1-x}Ge_x$ films on a silicon substrate, reference is made to U.S. Pat. No. 5,298,452 by B. S. Meyerson which issued Mar. 29, 1994 entitled "Method and Apparatus for Low Temperature, Low Pressure Chemical Vapor Deposition of Epitaxial Silicon Layers" which is incorporated herein by reference.

Figure 2:
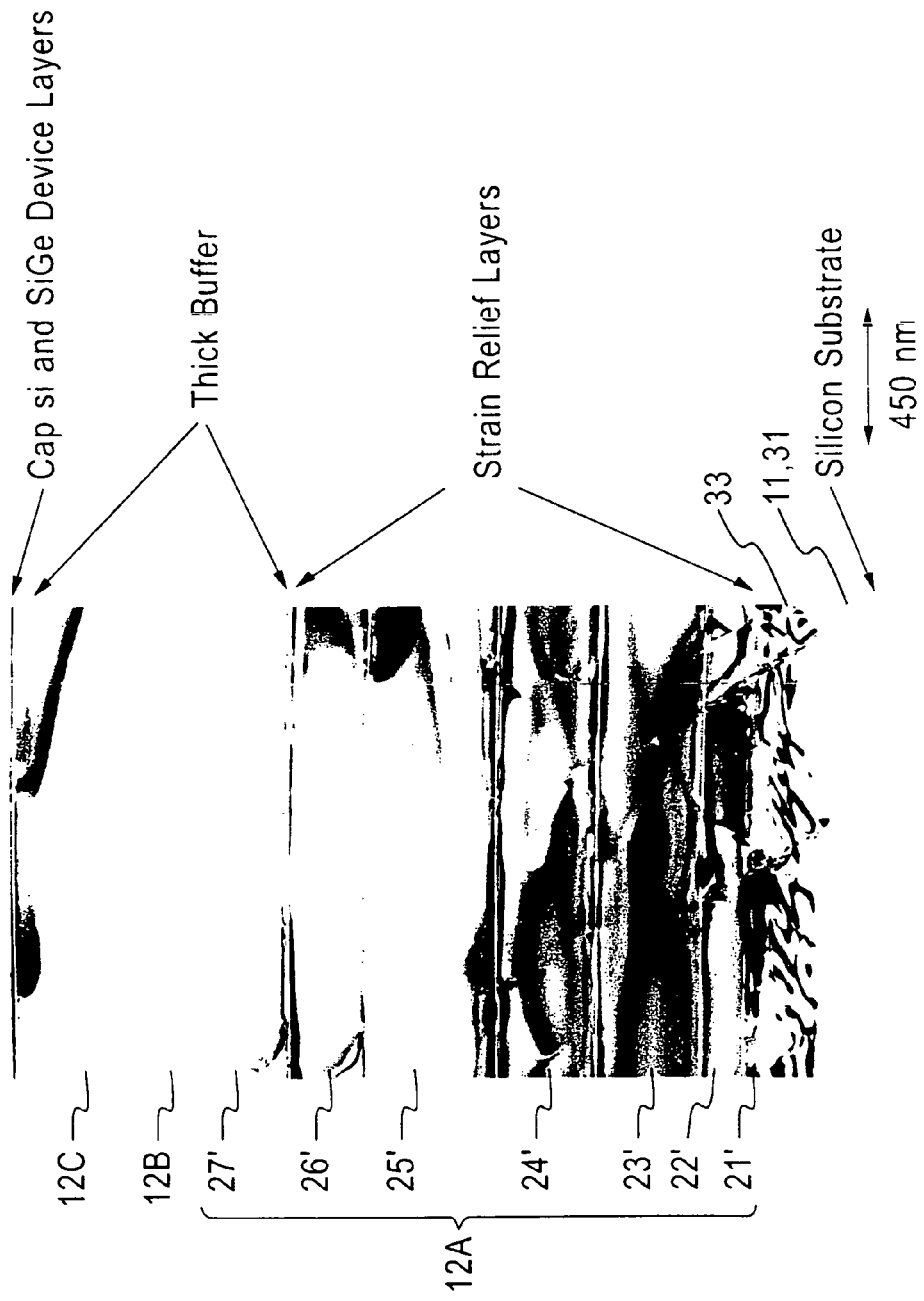
FIG. 2 is a cross-sectional TEM of a fabricated sample illustrating the complete layered structure of the embodiment of the invention shown in FIG. 1.
Figure 3:
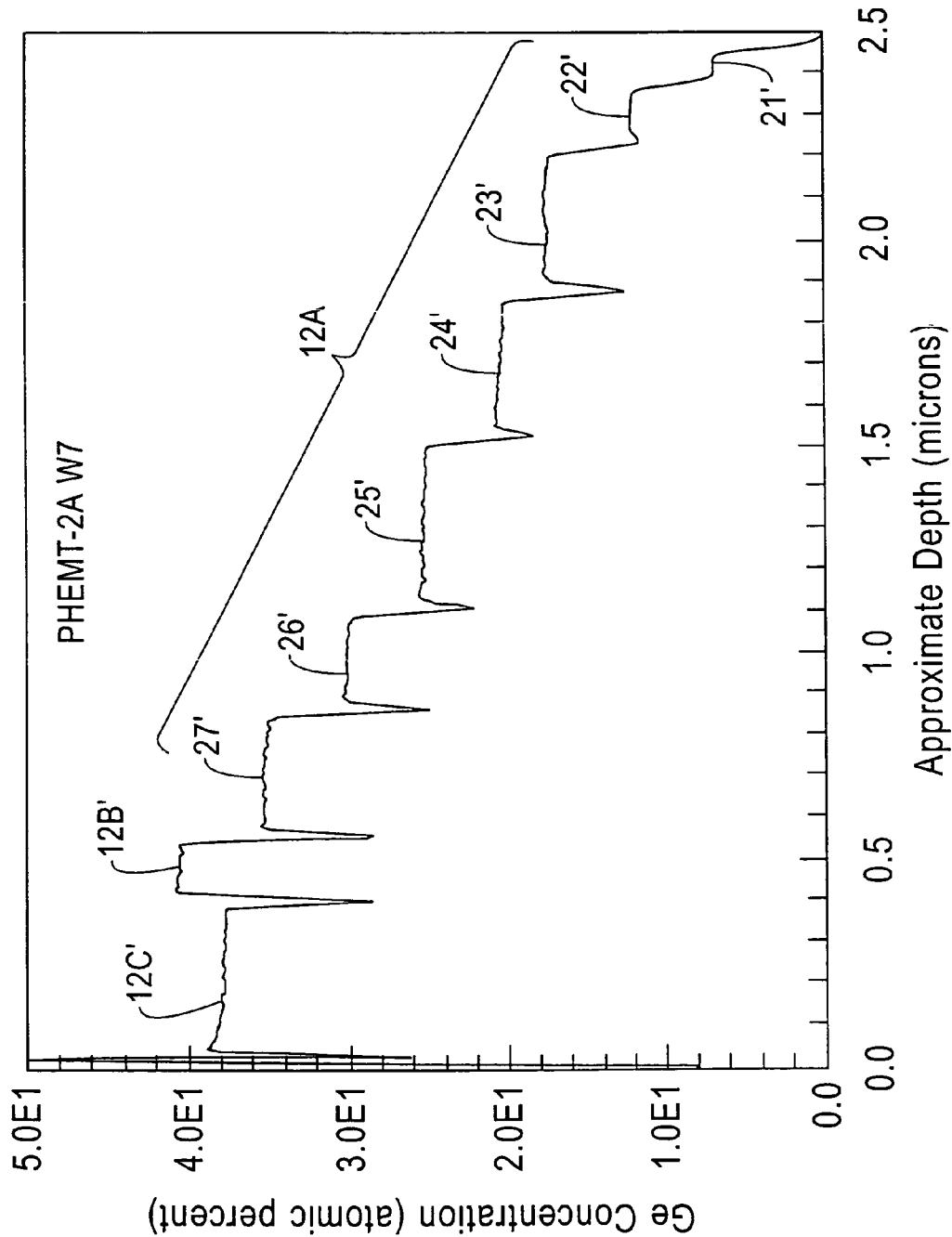
FIG. 3 is a SIMS graph showing the Ge concentration versus depth for the fabricated sample structure shown in FIG. 2 illustrating the preferred Ge compositional layered structure of the embodiment of the invention.

An illustration of a preferred layered structure 20 is shown in FIG. 2 which is the lower portion of layered structure 10 shown in FIG. 1. FIG. 2 shows a cross-sectional TEM view of a fabricated layered structure 20 comprising layers 12A, 12B, 12C, and 13–18 grown on a preferred silicon substrate 31. The corresponding Ge compositional profile of SiGe layered structure 20 of FIG. 2 as measured by secondary ion mass spectroscopy (SIMS) is shown in FIG. 3. In FIG. 3, the ordinate respresents Ge concentration in atomic percent and the abscissa represents approximate depth in microns. In FIG. 3, curve portions 21'–27', 12B' and 12C' correspond to the Ge concentration in layers 21–27, 12B and 12C shown in FIG. 2.

Figure 4:
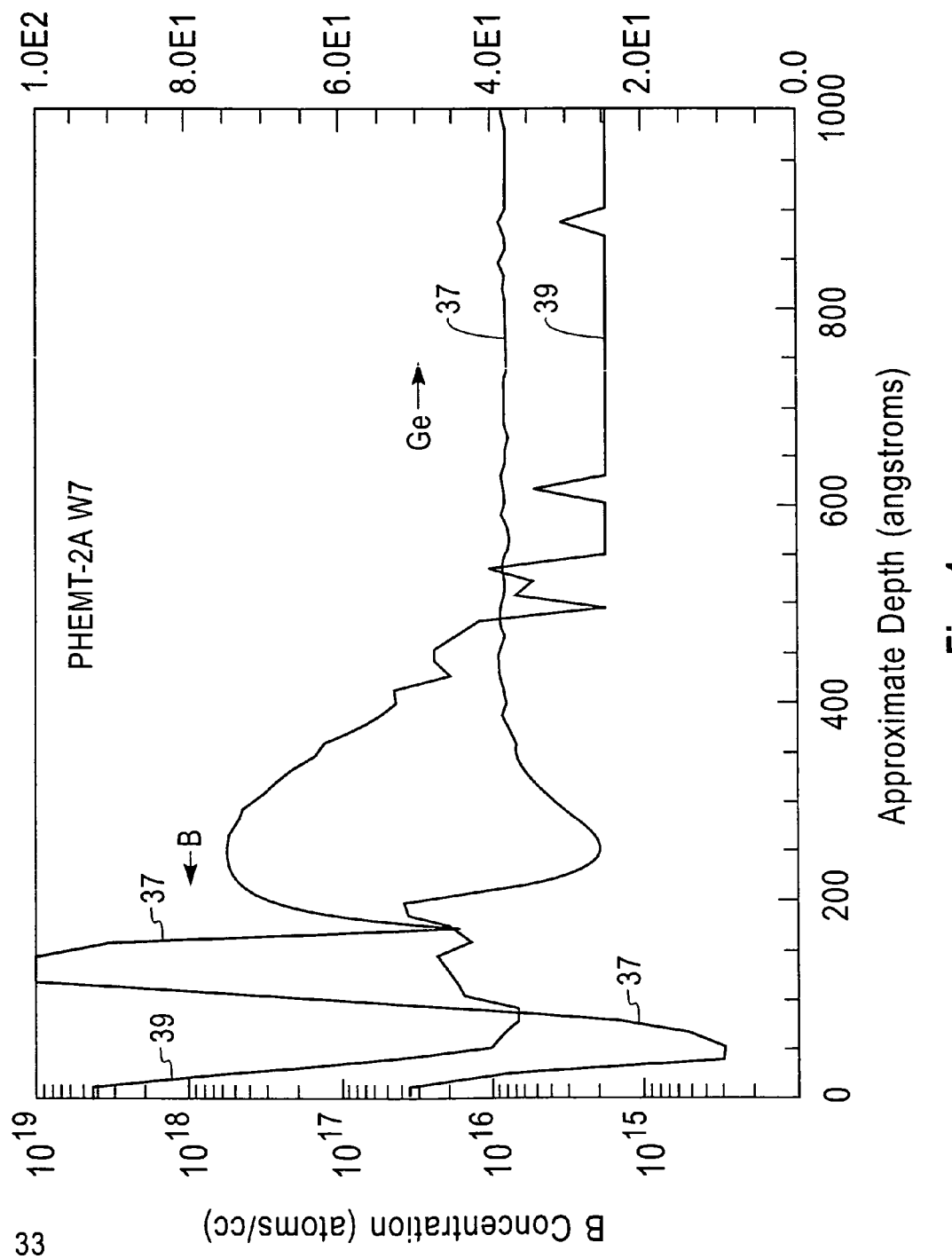
FIG. 4 is an expanded SIMS view of the top part of FIG. 3 to a depth of about 1000 Å showing the B and Ge concentration for the modulation-doped device region.

FIG. 4 is an expanded view of just the top part of FIG. 3 showing the device region only. In FIG. 3A, the ordinate on the right side represents Ge concentration in atomic percent and the abscissa represents approximate depth in angstroms. Curve 37 shows the Ge concentration as a function of approximate depth. In FIG. 4, the ordinate on the left side represents boron concentration in atoms/cc and curve 39 shows the boron concentration as a function of approximate depth.

The first epitaxial layer, described as layer 12A in FIGS. 1 and 2, of a relaxed $Si_{1-x}Ge_x$ formed on the upper surface of substrate 11, 31 is comprised of a step-graded Ge compositional layer structure comprising layers 21–27. Layers 21–27 have a preferred profile shown in FIG. 3 where the strain has been relieved in the buffer layers 21–27 or below in substrate 11, 31 via a modified Frank Read source as a mechanism to generate new dislocations 33 which is shown in FIG. 2 and described in U.S. Pat. No. 5,659,187 which issued on Aug. 19, 1997 to F. K. Legoues and B. S. Meyerson, and herein incorporated by reference.

Buffer layer 12 comprises layers 12A, 12B and 12C and may be initially undoped, relaxed, and have a Ge composition at interface 19 between layers 12 and 13 in the range from about 30% to about 50% with a preferred value of about 35%.

The design of layer 12 is actually made of a starting $Si_{1-x}Ge_x$ layer 12A of a graded Ge composition formed over a Si substrate 11, 31 followed by an overshoot layer of $Si_{1-y}Ge_y$ layer 12B where y=x+z and z is in the range of 0.01 to 0.1 with a preferred value of 0.05 formed over layer 12A, and finally by a more relaxed $Si_{1-x}Ge_x$, layer 12C, formed over layer 12B. Basically, the overshoot layer 12B functions to ensure a high degree of relaxation, i.e. >90% for the top $Si_{1-x}Ge_x$ surface layer 12C at interface 19. In the preferred case of achieving a fully relaxed $Si_{0.65}Ge_{0.35}$ layer 12C, it is desirable to use an overshoot layer 12B of $Si_{0.60}Ge_{0.40}$ as shown in FIG. 3 by curve portion 12B' with respect to curve portions 21'–27'. In relaxed $Si_{1-x}Ge_x$ layer 12C, the in-plane lattice parameter, $\alpha_{SiGe}(x)$, is given by equation (1):

$$\alpha_{SiGe}(x) = \alpha_{Si} + (\alpha_{Ge} - \alpha_{Si})x \tag{1}$$

where x is the Ge content and 1−x is the Si content and $\alpha_{Si}$ and $\alpha_{Ge}$ corresponds to the lattice constant for Si and Ge respectively, and consequently in the preferred case when the top $Si_{0.65}Ge_{0.35}$ surface layer is >90% relaxed, layer 12C would have a lattice constant which is greater than 4.956 Å. Structurely, layer 12 serves to relax the strain caused by the lattice mismatch between the top surface or interface 19 of relaxed layer 12C and the underlying Si substrate 11, 31 where there is a 4.2% lattice misfit as Ge has a lattice spacing of 1.04 times larger than the lattice spacing of single crystal Si. The buffer thickness of layer 12 can range from 0.2 to 5 μm but the preferred thickness is about 2.5 μm with a Ge compositional profile increasing from x=0 in a preferred stepwise fashion (compared to a continuous, linearly graded fashion) to a value in the range from x=0.10 to 1.0 with a preferred value of x=0.35 using a stepwise increase of 0.05 Ge per incremental layer as shown in FIG. 2 by layers 21–27 and in FIG. 3 by curve portions 21'–27'.

Figure 5:
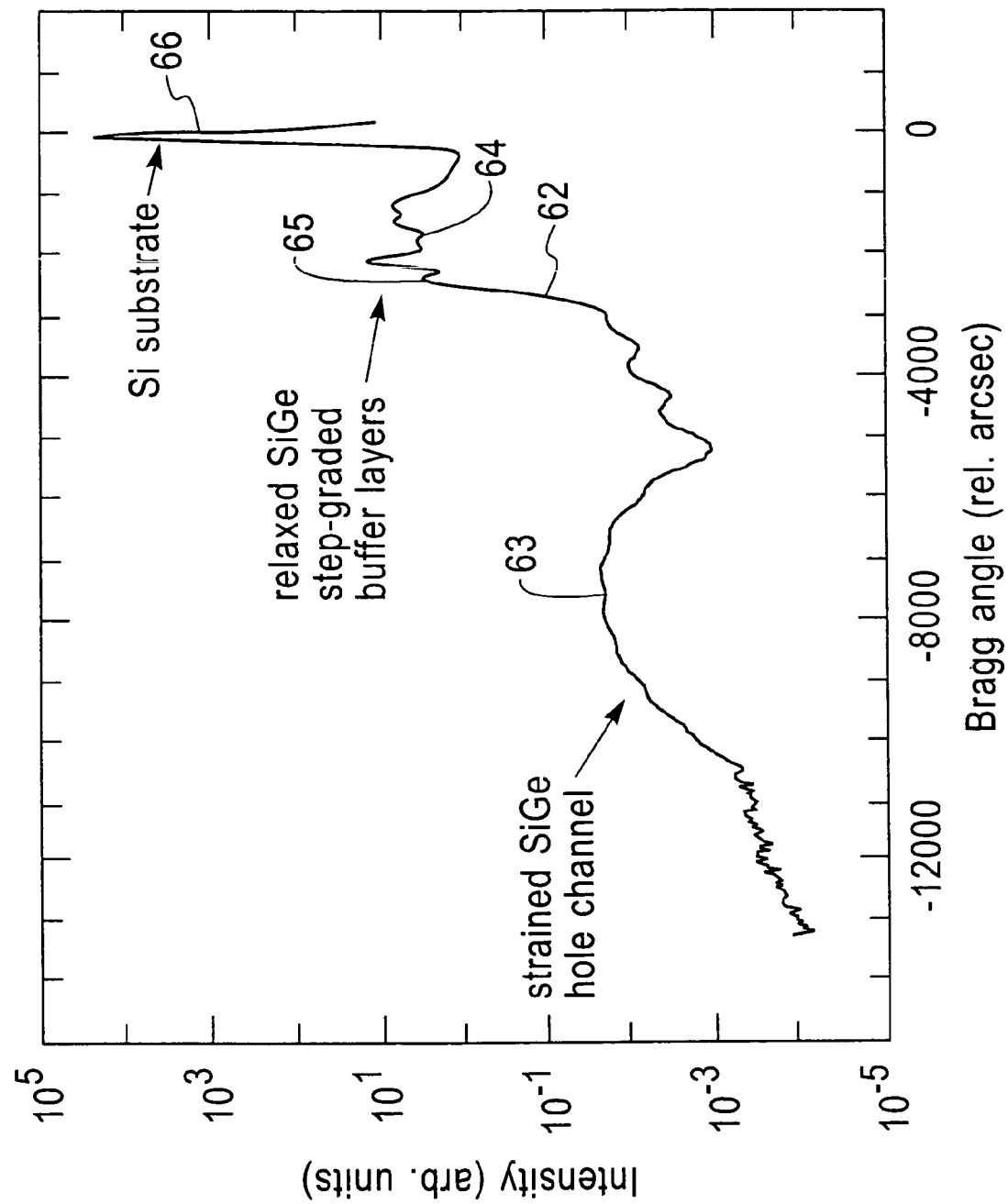
FIG. 5 shows the X-ray rocking curves for the (004) reflection from the relaxed fabricated layered structure shown in FIG. 2.

To assess the ability of layer 12 to achieve a fully relaxed $Si_{0.65}Ge_{0.35}$ buffer, high resolution x-ray diffraction (XRD) was used to characterize the fabricated sample structure of FIG. 2. The measured spectrum is shown by x-ray rocking curve 62 for the (004) reflection in FIG. 5 which after analysis indicates that the upper part of SiGe buffer layer 12C at interface 19 is at a lattice parameter corresponding to a Ge compositional value of x=0.35 with a strain relaxation of about 95% with respect to the underlying Si substrate 31. In FIG. 5, the ordinate represents intensity in arbitrary units and the abscissa represents Bragg angle. Curve portion 63 of curve 62 shows the measured diffraction spectra for the composite hole channel 16 and 17. Curve portion 64 of curve 62 shows the measured diffraction spectra for the step graded layer 12. Curve portion 65 of curve 62 shows the measured diffraction spectra for the overshoot layer 12B. Curve portion 66 of curve 62 shows the measured diffraction spectra for substrate 11.

The preferred method of growing silicon and silicon containing films, i.e. Si:B, Si:P, SiGe, SiGe:B, SiGe:P, SiGeC, SiGeC:B, SiGeC:P is the UHV-CVD process as described in U.S. Pat. No. 5,298,452 by B. S. Meyerson mentioned above. A UHV-CVD reactor suitable for growing the above-mentioned silicon and silicon containing films is available from Leybold-Heraeus Co. in Germany, Epigress in Sweden, and CVD Equipment Corp. in Ronkonkoma, N.Y., USA.

In layered structure 10 for a composite p-channel modulation-doped SiGe heterostructure, a p-doped relaxed SiGe layer 13 as shown in FIG. 1 is first formed over layer 12C to function as the donor or supply layer beneath an active channel. Layer 13 may have a thickness in the range from 1 to 20 nm with a preferred thickness in the range from 4 to 5 nm and should have an electrically active donor dose in the range from 1 to $3 \times 10^{12}$ cm$^{-2}$. The p-type dopant of layer 13 may be incorporated in SiGe layer 13 by doping with different flows of $B_2H_6$ during epitaxial growth of layer 13. An example of a preferred boron dopant profile for SiGe layer 13 is shown in FIG. 3A with an integrated dose of $1.5 \times 10^{12}$ boron/cm$^2$. An undoped strained Si layer 14 is epitaxially formed above p-doped layer 13 as a spacer layer. Layer 14 functions to separate the dopants in layer 13 from the active channel layers 16 and 17 to be formed above. The thickness of layer 14 should remain below the critical thickness of a silicon layer with respect to the lattice spacing at interface 19 of relaxed layer 12. The preferred thickness of layer 13 is in the range from 1 to 2 nm in the case when layer 12 at interface 19 is a relaxed $Si_{0.65}Ge_{0.35}$ layer.

Figure 6:
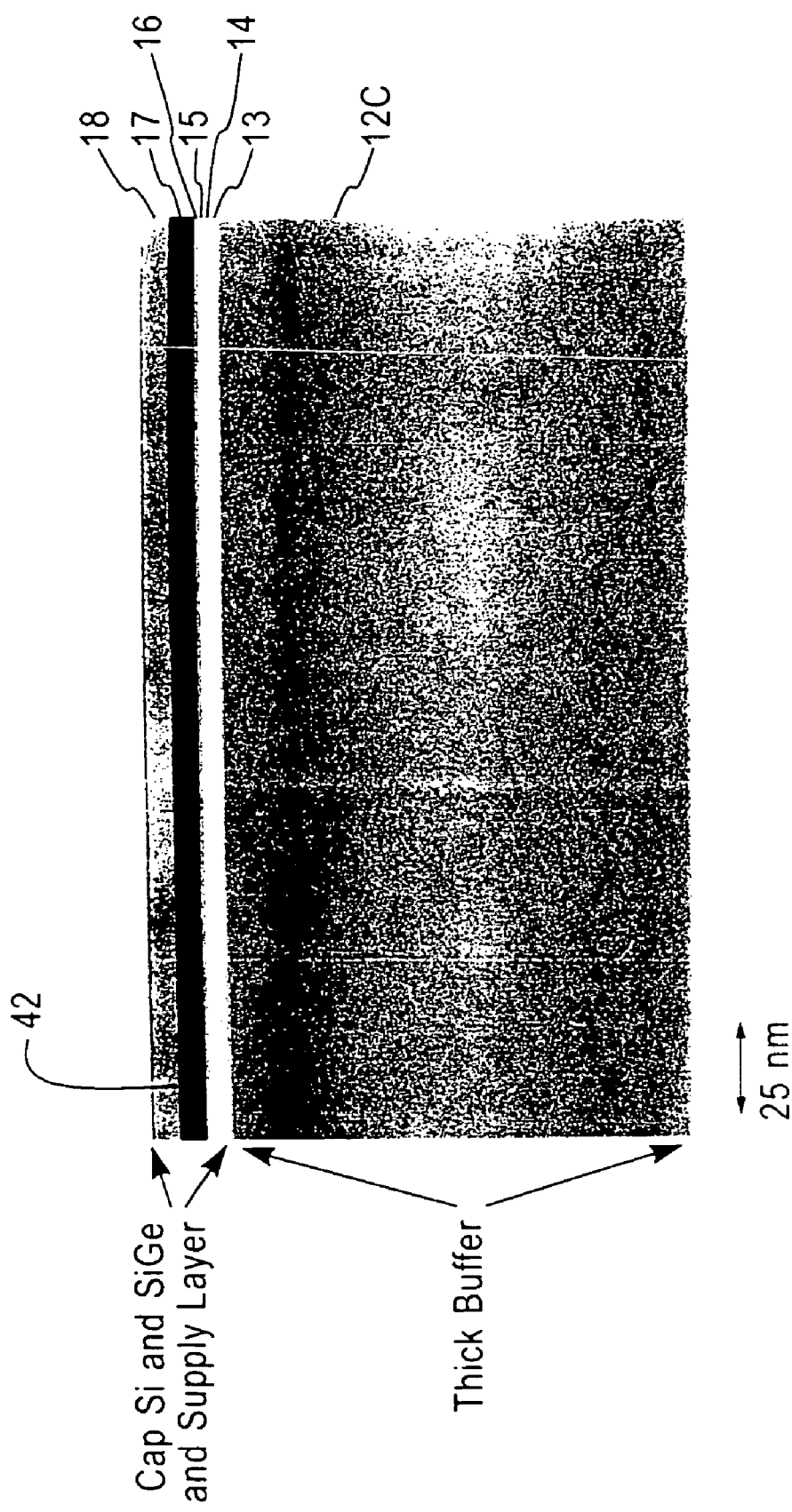
FIG. 6 is a detailed cross-sectional TEM of the upper device region of the fabricated sample structure shown in FIG. 2 illustrating the composite p-channel modulation-doped device structure of the embodiment of the invention.

Next, a thin relaxed undoped SiGe layer 15 is epitaxially grown over layer 14 and similar to layer 14, functions as a spacer layer to further separate the dopants in layer 13 from the above composite channel 33 comprising layers 16 and 17 in order to maintain a high hole mobility in layers 16 and 17. The thickness of layer 15 may range from 0 to 10 nm, with the preferred thickness in the range from 4 to 5 nm. A compressively-strained Ge layer 16 is epitaxially grown above layer 15 which functions as the first part of a composite p-channel 33 for p-channel field effect transistors. For a detailed description of a UHV-CVD method for growing an epitaxial Ge film on a silicon substrate, reference is made to U.S. Pat. No. 5,259,918 by S. Akbar, J. O. Chu, and B Cunningham which issued Nov. 9, 1993 entitled "Heteroepitaxial Growth of Germanium on Silicon by UHV/CVD" which is incorporated herein by reference. In order for layer 16 to be an effective component in the composite p-channel 33, the epitaxial Ge must be of device quality layer void of structural defects, e.g. stacking faults and any interface roughness problems between layers 16 and 17. For example, in the preferred case when layer 12C is a relaxed $Si_{0.65}Ge_{0.35}$ layer at interface 19, the thickness of Ge layer 16 may be in the range from 0 to 25 Angstroms with a preferred thickness of 20 Angstroms as shown in FIG. 6. It should be noted that to maintain a layer thickness of 20 Angstroms for Ge layer 16, it is critical that layer 12 at interface 19 must be equal to or at least equivalent in lattice spacing to a 90% relaxed $Si_{0.65}Ge_{0.35}$ buffer. Otherwise, stacking faults will occur in Ge layer 16 in the case when grown on a smaller lattice spacing corresponding to a less relaxed or lower Ge content buffer layer 12 at interface 19 as shown in FIG. 7.

FIG. 6 shows Ge layer 16 with stacking faults in the range from $10^4$ to $10^6$ defects/cm$^2$. The stacking faults originating in Ge layer 16 may extend upwards into Si12:15 $PM_{1-w}Ge_w$ layer 17. $Si_{1-w}Ge_w$ layer 17 also should have stacking faults in the range from $10^4$ to $10^6$ defects/cm$^2$. In FIG. 6, the smoothness of the upper surface of layer 17 at interface 42 is shown. Stacking faults are reduced to below $10^6$ defects/cm$^2$ by the 90% relaxation of layer 12 at interface 19. The percent of relaxation of a layer can be determined by measuring the lattice constant such as by X-ray diffraction (XRD) as mentioned above.

Figure 7:
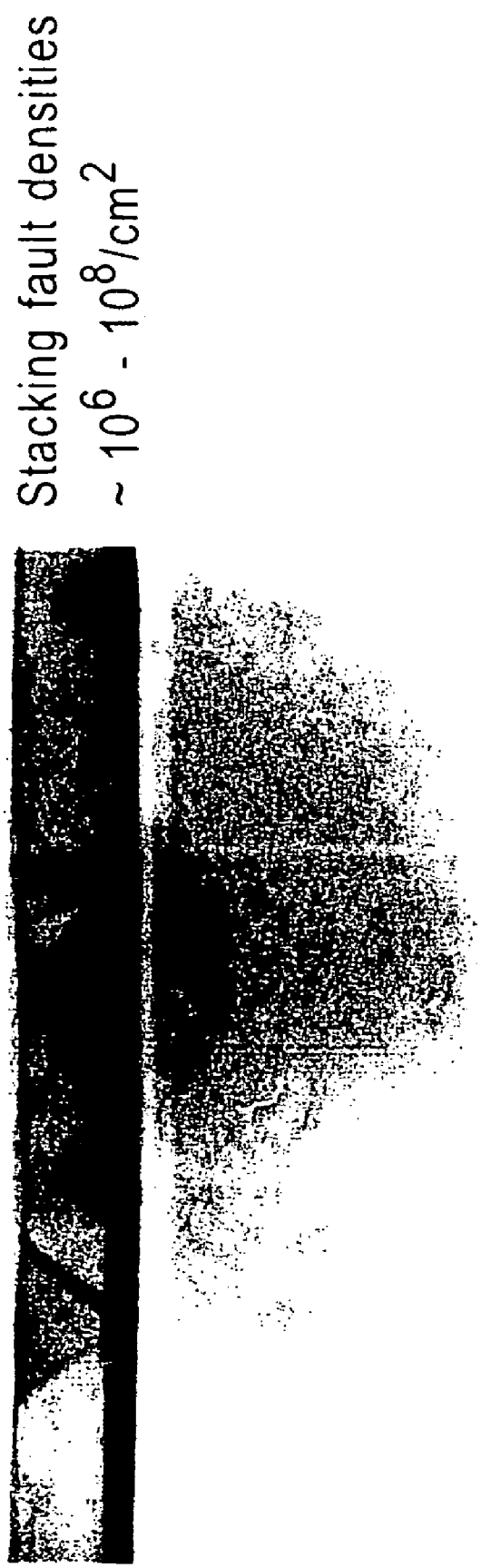
FIG. 7 is a detailed cross-sectional TEM of a channel region of a device structure when fabricated on a less relaxed buffer as compared to the layered structure of FIG. 1 illustrating the presence of stacking faults in the active channel.

FIG. 7 shows layers 12–18 similar to FIG. 6, but in FIG. 7 layer 12 and specifically at interface 19 the lattice constant corresponded to a relaxation of less than 90% resulting in stacking faults of above $10^6$ defects/cm$^2$ and typically in the range from $10^6$ to $10^8$ defects/cm$^2$ which are undesireable for electronic devices.

Above layer 16, a compressively strained SiGe layer 17 is epitaxially grown which will serve as the second part of composite channel 33 of a p-channel field effect transistor. The Ge composition for SiGe layer 17 may range from 50% to <100%, and the preferred composition is 80% with a thickness ranging from 40 to 100 Angstroms. Alternatively, SiGe layer 17 may have the germanium content graded within SiGe layer 17, decreasing from, for example, 0.95 Ge at the lower portion of the layer nearer the Ge layer 16 to about 0.50 Ge at the upper part of SiGe layer 17.

Above layer 17, a SiGe cap layer 18 is grown having the preferred Ge composition the same as that of layer 12C at interface 19 and functions to separate p-channel 33 from the surface and to confine the hole carriers in layers 16 and 17. The thickness for layer 17 may range from 2 to 20 nm, with the preferred thickness in the range from 10 to 15 nm. Layers 13, 15, and 18 may have the same composition of silicon and germanium to provide the same lattice spacing where the Ge content may be in the range from 20 to 50% with a preferred value of 35% in the case when layer 12C at interface 19 has a lattice spacing equivalent to a relaxed $Si_{0.65}Ge_{0.35}$ buffer layer.

The channel confinement of holes and its enhanced transport mobility is a result of the higher compressive strain in the composite channel structure having two high Ge content layers with respect to the relaxed buffer layer of layer 12 at interface 19 arising from the 4.2% larger lattice constant for pure Ge relative to Si. The structural ability to create and enhance the compressive strain in the SiGe or Ge channel layers formed on the relaxed SiGe buffer of layer 12 can significantly alter the conduction and valence bands of the p-channel layers of 16 and 17. Moreover, an important parameter for the design of the p-channel modulation-doped heterostructure is the valence-band offset ($\Delta E_v$) of the compressively strained $Si_{1-x}Ge_x$ or Ge channel layer relative to the relaxed $Si_{1-x}Ge_x$ epilayer of layer 12, and is given by equation (2):

$$\Delta E_v = (0.74 - 0.53x')x (eV) \qquad (2)$$

where x' is the Ge content of the relaxed SiGe epilayer of layer 12 and x is the Ge content in the hole channel. This formulation is reported in a publication by R. People and J. C. Bean entitled "Band alignments of coherently strained $Ge_xSi_{1-x}/Si$ heterostructures on <001> $Ge_ySi_{1-y}$ substrates", Appl. Phys. Lett. 48 (8), 24 Feb. 1986, pp 538–540 which is incorporated herein by reference. More specifically, the valence band discontinuity ($\Delta E_v$) for layer 17 when it is a $Si_{0.2}Ge_{0.8}$ channel formed over a relaxed $Si_{0.65}Ge_{0.35}$ of layer 12 would be 443 meV, and in the case of a pure Ge channel of layer 16 an even larger band offset of 554 meV is generated in the hole or valance band which would essentially produce a deeper quantum well or a more effective barrier for hole confinement. Importantly, the compressive strain in the SiGe or Ge layer also serves to split the valence band into the heavy hole and light-hole bands whereby the hole transport in the upper valence band with the lighter hole mass for carrier transport along the strained channel will result in enhanced hole mobilites that could be significantly higher as described below than in Si p-channel field effect transistors which typically has a mobility of about 75 cm$^2$/Vs as reported in a publication by M. Rodder et at. entitled "A 1.2V, 0.1 µm Gate Length CMOS Technology: Design and Process Issues", IEDM 98-623. Consequently, the measured hole mobilities in the occupied hole band for the composite channel structure are in the range from 900 to 1400 cm$^2$/Vs at 300K and in the range from 5000 to 10000 cm$^2$ Vs at 20K for the case when layer 17 is a $Si_{0.2}Ge_{0.8}$ channel with a thickness in the range from 7 to 8 nm and layer 16 is a Ge channel with a thickness in the range from 1.5 to 2.0 nm.

Figure 8:
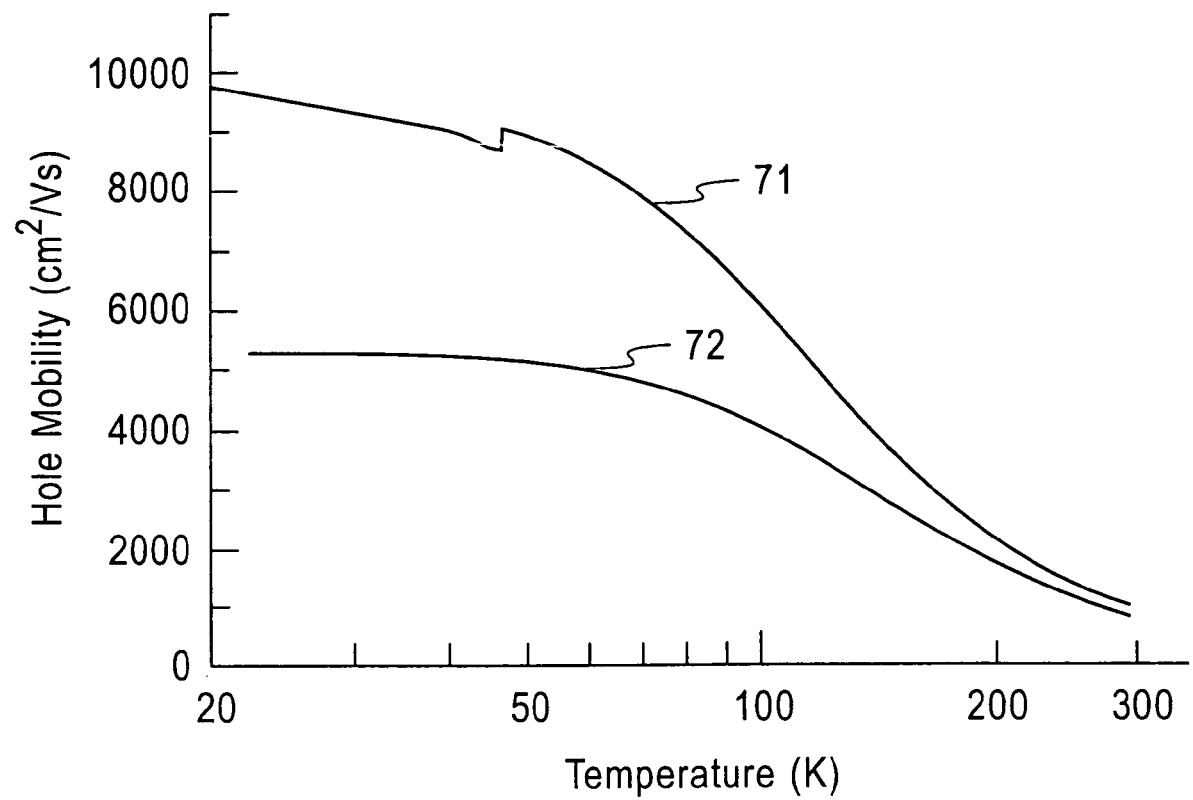
FIG. 8 is a graph of the measured hole mobility versus temperature in Kelvin (K) from Hall measurements comparing the hole mobility behavior of a high quality p-channel device structure shown in FIG. 5 with a poor quality p-channel device structure filled with stacking faults shown in FIG. 6.

Furthermore, FIG. 8, curve 71, shows the measured two-dimensional hole gases (2DHG) hole mobility behavior as a function of temperature for composite p-channel 33 of $Si_{0.2}Ge_{0.8}$/Ge when grown on a properly relaxed $Si_{0.65}Ge_{0.35}$ buffer layer 12, and compares it to curve 72 which shows the degraded mobility behavior associated with a poor quality or defective composite channel structure of $Si_{0.2}Ge_{0.8}$/Ge when grown on a lower content $Si_{0.75}Ge_{0.25}$ buffer showing the sensitivity of the composite p-channel 33 to the proper design of layer 12 such as the composition profile, extent of relaxation, and remaining stacking faults and misfit dislocations. In FIG. 8, the ordinate represents hole mobility $\mu_h$ in cm$^2$/Vs and the abscissa represents temperature in degrees K. The degraded mobility behavior shown by curve 72 is due to the presence of stacking faults occurring in the composite p-channel 33 of $Si_{0.2}Ge_{0.8}$/Ge, as illustrated in FIG. 7 in the case when the composite p-channel 33 is fabricated on a less relaxed or a lower Ge content epitaxial layer relative to layer 12 of $Si_{0.65}Ge_{0.35}$. The measured mobilities as shown by curve 71 for a $Si_{0.2}Ge_{0.8}$/Ge composite p-channel 33 are a factor of 6 to 7 higher than found in Si p-channel field effect transistors. The measured mobilities as shown by curve 71 for composite p-channel 33 had a defect density similar to that shown in FIG. 6 and is typically in the range from $10^4$ to $10^6$ defects/cm$^2$. The measured mobilities as shown by curve 72 for composite p-channel 33 had a defect density similar to that shown in FIG. 7 and is typically in the range from $10^6$ to $10^8$ defects/cm2. At 300K, the mobility $\mu_h$ of composite p-channel 33 equals 1,360 cm$^2$/Vs at a sheet carrier density of $1.4 \times 10^{12}$ cm$^{-2}$. At 20K, the mobility $\mu_h$ of composite p-channel 33 equals 9,800 cm$^2$/Vs at a sheet carrier density of $3.17 \times 10^{12}$ cm$^{-2}$.

Figure 9:
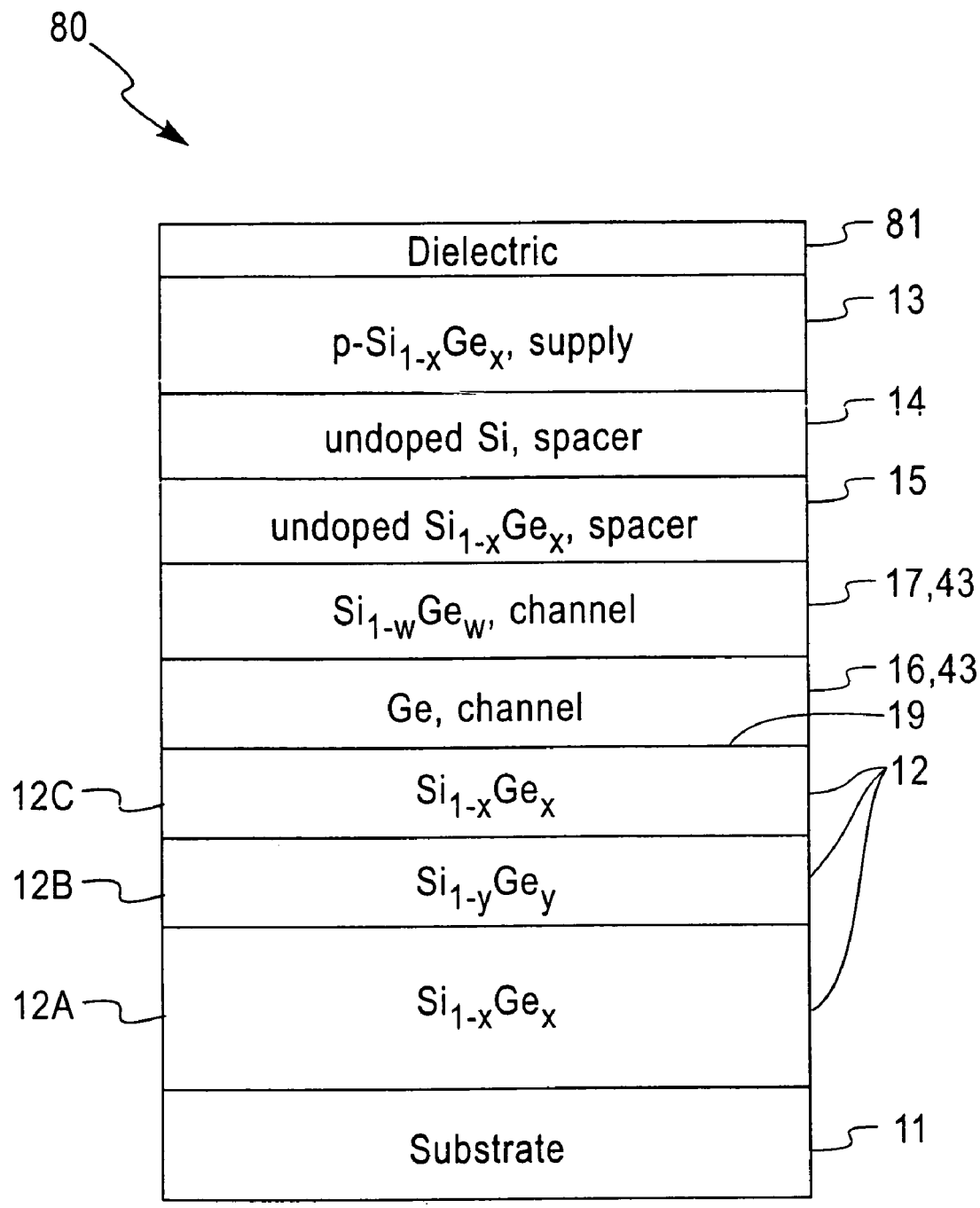
FIG. 9 is a cross section view of a layered structure illustrating a second embodiment of the invention.

In an alternate embodiment shown in FIG. 9, channel 43 comprising layers 16 and 17 are formed above buffer layer 12, SiGe layer 15 is formed above channel 43, Si layer 14 is formed above layer 15 and the supply layer, p-doped $Si_{1-x}Ge_x$ layer 13 is formed above Si layer 14. A dielectric layer 81, for example, silicon dioxide is formed over SiGe layer 13. In FIG. 9, like references are used for functions corresponding to the apparatus of FIG. 1.

In FIG. 1, either one of spacer layers, for example, Si spacer layer 14 or SiGe spacer layer 15 may be structurally omitted from the composite p-channel 33 layered structure 10 without introducing any major degradation in the hole confinement and mobility of the carriers in p-channel 33.

In the design of a modulation-doped device 80 shown in FIG. 9, a thicker spacer of spacer layers 15 and 14 is usually more desirable and important when attempting to optimize the carrier mobility transport at low temperatures (i.e. less than <20 K) by further separation of the active carriers in p-channel 43 from ionized hole donors in the supply layer 13. Nevertheless, for room temperature transport, there is minimal observable effect (if any at all) when only one spacer layer of either Si spacer layer 14 or SiGe spacer layer 15 is present to space composite channel 43 of modulation-doped device 80 from supply layer 13.

In a modulation-doped device 80 where supply layer 13 is situated above active channel 43 as shown in FIG. 9, the composite p-channel layers are comprised of thin Ge layer 16 (less than the critical thickness at interface 19 about 10 to 20 Å) and a SiGe layer 17. Ge layer 16 is first formed on layer 12C to form interface 19. Layers 16 and 17 function as the channel region 43 of a field effect transistor. Next, spacer layers comprised of SiGe spacer layer 15 and Si spacer layer 14 are grown over channel layer 17 which functions to separate the dopants in the above supply layer 13 from the below active channel of layers 16 and 17. Above spacer layer 14, a p-doped SiGe supply layer 13 is formed which functions as a donor layer or supply layer above active channel layers of 16 and 17. The germanium composition and thickness for layers 16, 17, 15, 14, and 13 may be the same or equivalent to those of like reference numbers in FIG. 1 which shows a composite channel layered structure 10 with the SiGe supply layer 13 below channel 33.

Figure 10:
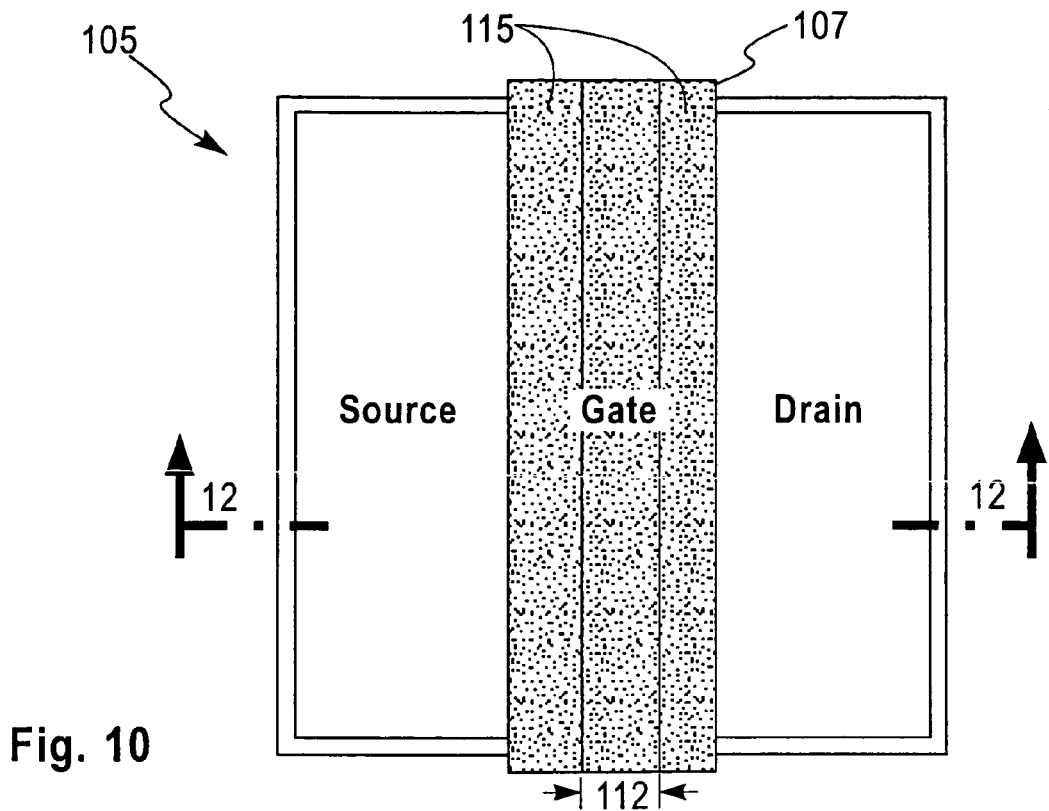
FIG. 10 is a plan-view diagram of a field-effect transistor.
Figure 11:
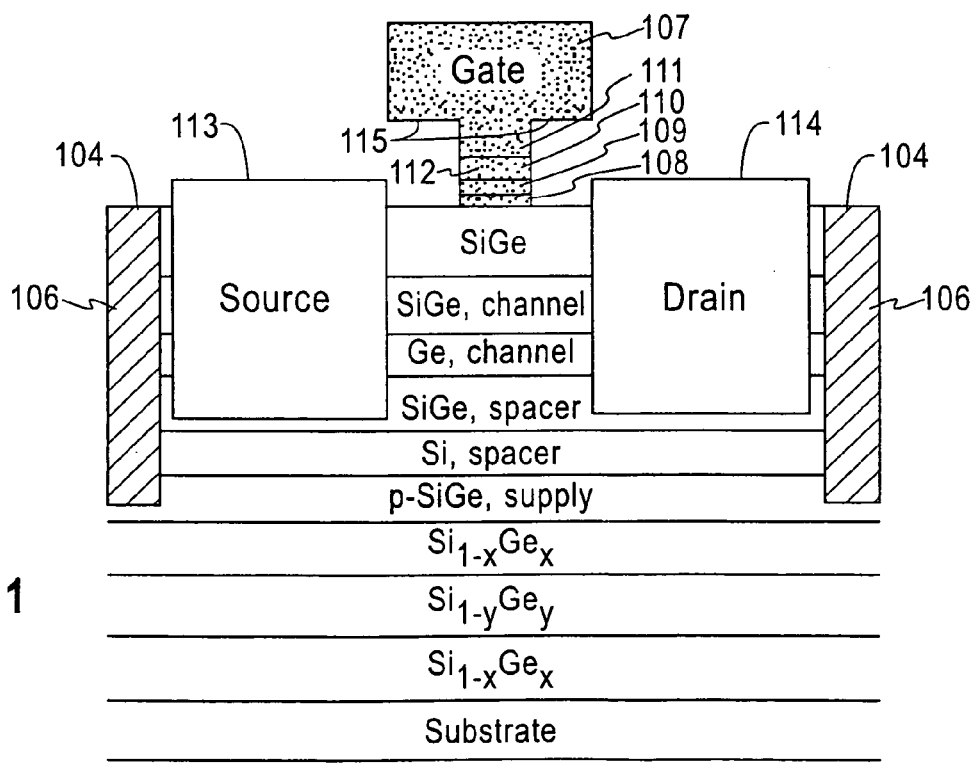
FIG. 11 is a cross-section view along the line 12—12 of FIG. 11 showing the composite p-channel layer structure.

A plan view of a self-aligned p-type SiGe MODFET device is shown in FIG. 10. A cross section view along the line 12—12 of FIG. 10 is shown in FIG. 11. A self-aligned MODFET design is preferred to minimize the access resistance associated with a Schottky gated device structure, and the process usually requires patterning and evaporation of the gate metallization prior to the source/drain Ohmic metallization. A T-shaped gate is fabricated such that the gate overhang serves as a mask for the source and drain Ohmic contact evaporation which prevents shorting of the source and drain Ohmic contacts to the Schottky gate footprint. This basic process scheme has been reported in a publication by M. Arafa, K. Ismail, J. O. Chu, B. S. Meyerson, and I. Adesida, entitled "A 70-GHz fT low operating bias self-aligned p-type SiGe MODFET", *IEEE Elec. Dev. Lett.* vol. 17(12), December 1996, pp. 586–588 which is incorporated herein by reference. As shown in FIG. 11, the device consists of the layer structure described in FIG. 1, and in FIG. 11 like references are used for layers corresponding to the layers of FIG. 1. This layer structure design describes a modulation-doped heterostructure whereby p-type doped layer 13, which functions as the supply layer, is separated from layers 16 and 17, which function as the conducting channel region, by undoped layers 14 and 15, which function as the spacer layers. In FIG. 11, field-effect transistor 100 consists of isolation region 104 created by selectively removing layers 13, 14, 15, 16, 17 and 18 such that the conducting composite-channel region remains only in active device region 105. Isolation region 104 should completely surround active channel region 105 as shown in FIG. 10. Isolation region 104 can then be passivated by depositing insulating material 106, such as $SiO_x$, in isolation region 104 after etching. The gate structure preferably should be T-shaped, i.e. narrow at the bottom and wide at the top, and have the properties of a high Schottky barrier for holes, low resistivity, and a high temperature barrier for reaction with the substrate. Such properties can be obtained by utilizing a multi-level gate stack. In the preferred embodiment, the gate 107 is patterned by electron-beam lithography using a bi-layer or tri-layer P(MMA-PMAA) resist system, and defined using lift-off of Ti/Mo/Pt/Au. In this case, gate 107 is formed on layer 18, and from bottom to top, consists of a Ti layer 108, a Mo layer 109, a Pt layer 110 and an Au layer 111. This process enables gate footprint 112 dimensions less than 0.1 µm, and source-to-gate and drain-to-gate dimensions as small as 0.1 µm to be realized. Gate 107 should form a narrow stripe that completely divides the active device region into two distinct regions on either side. Self-aligned source and drain Ohmic contacts 113 and 114 can then be formed by evaporating a metal over active device region 105, such that the overhang section 115 of gate 107 acts as a shadow mask to avoid shorting of source and drain contacts 113 and 114 to gate 107. In the preferred embodiment, a thin 20–30 nm-thick layer of Pt is evaporated over active device region 105 and then silicided at T=200–400 C to form low resistance source and drain contacts 113 and 114.

Figure 12:
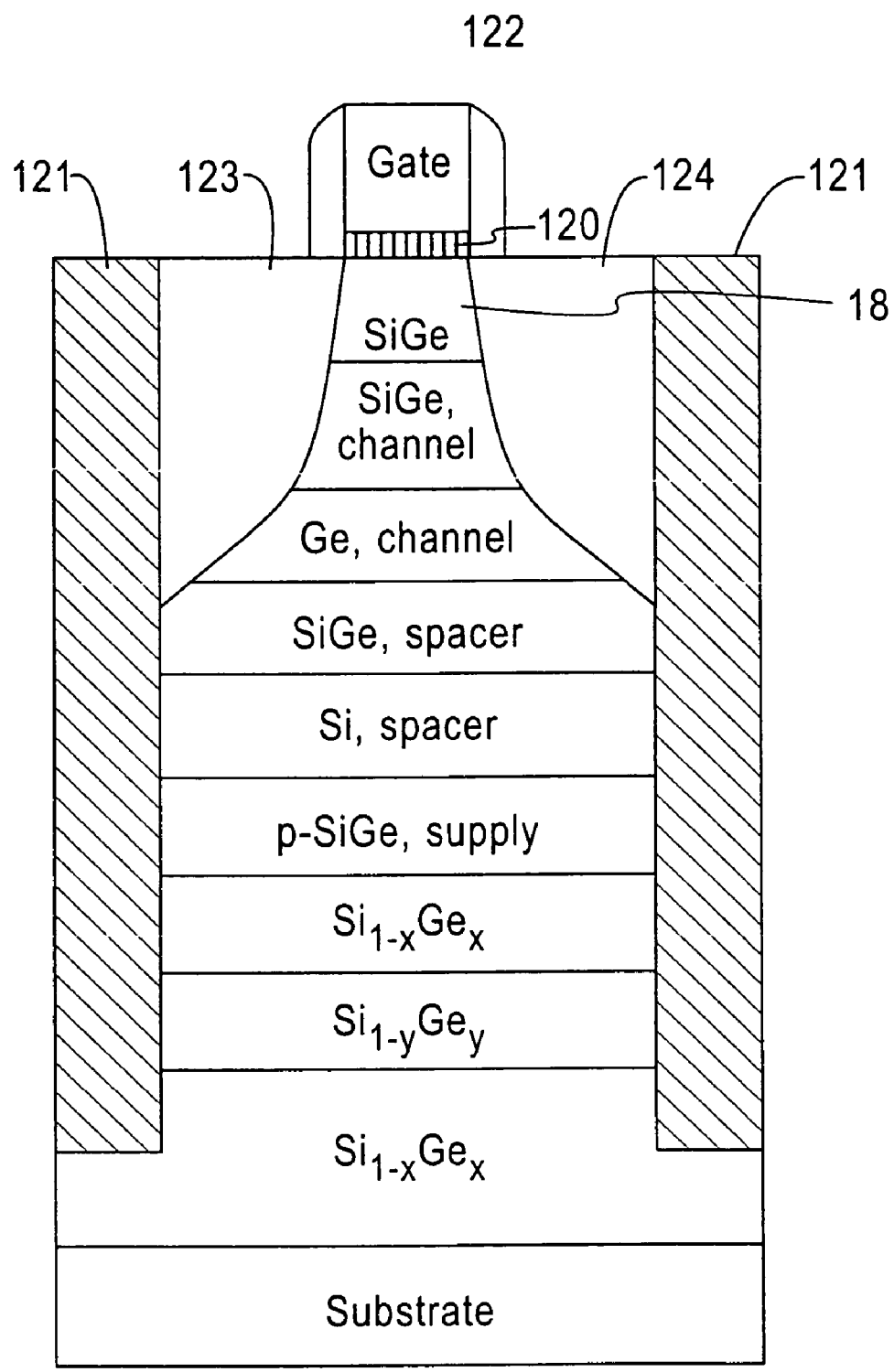
FIG. 12 is a cross-section view of an insulating gate field-effect transistor on a composite p-channel layer structure.

A cross-section view of an insulating gate field-effect transistor on a composite p-channel layer structure is shown in FIG. 12. The device consists of the layer structure described in FIG. 1, and in FIG. 12 like references are used for layers corresponding to the layers of FIG. 1. The device additionally consists of insulating layer 120, which is formed on top of SiGe layer 18. In the preferred embodiment layer 120 consists of $SiO_x$, or $Si_xN_y$. The device further consists of isolation region 121, gate 122, and source and drain contants 123 and 124, which are configured in a similar manner as described in FIG. 10. In the preferred embodiment, gate 122 is formed on insulating layer 120. After patterning of insulating sidewall regions 125, gate 122 acts as a mask for the formation of self-aligned Ohmic source and drain contacts 123 and 124.

Figure 13:
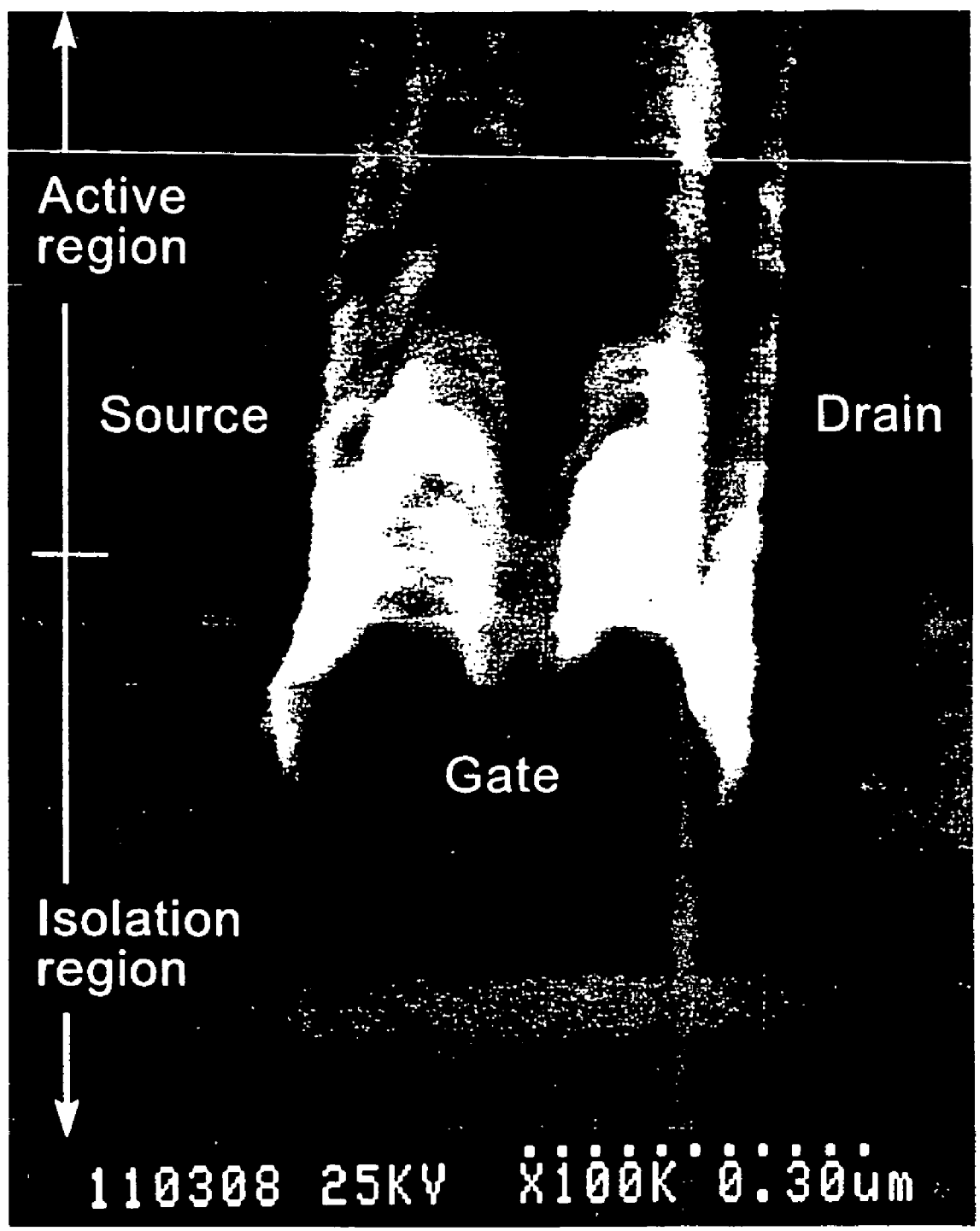
FIG. 13 is an SEM micrograph of a portion of a completed, self-aligned MODFET fabricated on a composite p-channel layer structure shown in FIGS. 11 and 12.

FIG. 13 shows an SEM micrograph of a portion of a completed, self-aligned MODFET fabricated on a composite p-channel layer structure described in FIG. 10 and FIG. 11. This particular device has a gate footprint of 0.12 µm, and source-to-gate spacing of 0.15 µm.

Figure 14:
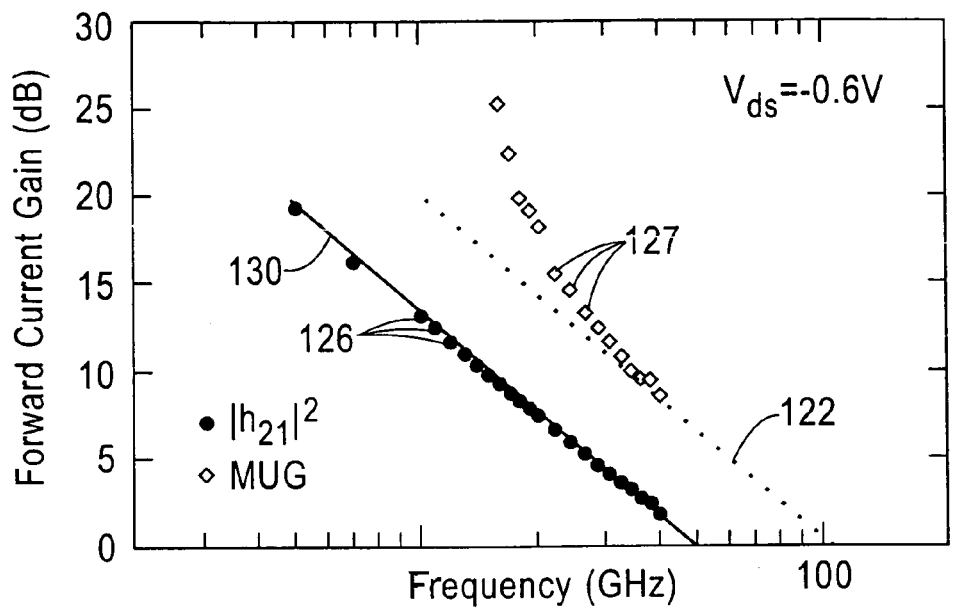
FIGS. 14 and 15 are plots of data points of the forward current gain and maximum unilateral gain versus frequency measured with $V_{ds}$ equal to −0.6V and −1.5V, respectively, of a p-MODFET fabricated with a composite p-channel layer structure similar to the MODFET shown partially in FIG. 13.
Figure 15:
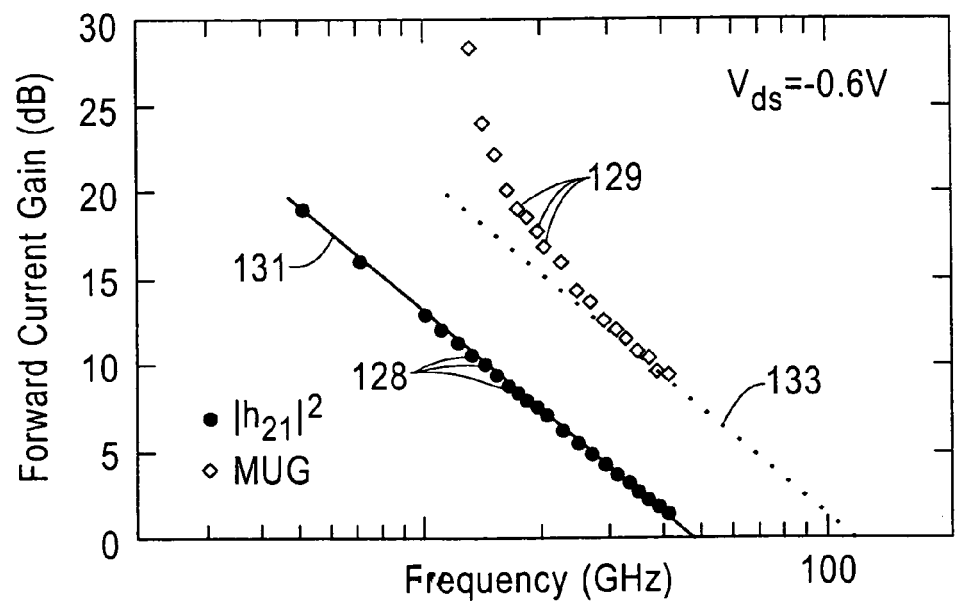

FIGS. 14 and 15 show graphs of the high-frequency characteristics of a self-aligned composite-channel p-MODFET at two different bias voltages. This device utilized the design shown in FIGS. 10 and 11, and had a gate footprint length of 0.09 µm and a gate width of 25 µm. The electrical results were obtained from microwave s-parameter data taken under optimum bias conditions at frequencies ranging from 5 to 40 GHz. The effect of parasitic elements arising from the microwave pad geometry have been removed by measuring an open-circuit pad geometry, and then de-embedding the response of the actual device geometry from the total system response.

FIG. 14 shows the forward current gain, $|h_{21}|^2$, represented by data points 126, and the maximum unilateral gain (MUG), represented by data points 127, plotted versus frequency, f for a drain-to-source bias voltage of $V_{ds}$=–0.6 V. FIG. 15 shows the forward current gain, $|h_{21}|^2$, represented by data points 128, and the maximum unilateral gain (MUG), represented by data points 129, plotted vs. frequency for a drain-to-source bias voltage of $V_{ds}$=–1.5 V. The unity current gain cutoff frequency, $f_T$, is obtained by extrapolating $|h_{21}|^2$ versus frequency at –20 dB/decade until $|h_{21}|^2$ is equal to unity. The extrapolation of data points 126, representative of $|h_{21}|^2$ at $V_{ds}$=–0.6 V, versus frequency is shown in FIG. 14 by solid curve 130. The extrapolation of data points 128, representative of $|h_{21}|^2$ at $V_{ds}$=–1.5 V, versus frequency is shown in FIG. 15 by solid curve 131. Similarly, the maximum frequency of oscillation, $f_{max}$, is obtained by extrapolating to unity the high-frequency values of MUG at –20 dB/decade until MUG is equal to unity. The extrapolation of data points 127, representative of MUG at $V_{ds}$=–0.6 V, versus frequency is shown in FIG. 14 by curve 122. The extrapolation of data points 129, representative of MUG at $V_{ds}$=–1.5 V, versus frequency is shown in FIG. 15 by curve 133. The extrapolations produce values of $f_T$=48 GHz and $f_{max}$=108 GHz at $V_{ds}$=–0.6 V, and $f_T$=46 GHz and $f_{max}$=116 GHz at $V_{ds}$=–1.5 V. To the inventors' knowledge, the values of $f_{max}$ are the highest ever obtained for a p-type field-effect transistor. The fact that $f_{max}$ exceeds 100 GHz at the low bias voltage of $V_{ds}$=–0.6 V is particularly impressive. The record high-frequency performance of these depletion mode field effect transistor devices, and the low bias voltages at which they were obtained, is a direct result of the high-mobility composite-channel layer structure, and the self-aligned T-gate device design described in FIGS. 10–11.

The invention claimed is:

1. A layered structure for forming electronic devices thereon comprising:
   a single crystalline substrate;
   a first layer of relaxed $Si_{1-x}Ge_x$ formed epitaxially on said substrate where the Ge fraction x is in the range from 0.35 to 0.5,
   an over-shoot layer, $Si_{1-y}Ge_y$, within the first layer, said over-shoot layer having a Ge fraction y, where y=x+z and z is in the range from 0.01 to 0.1, and having a thickness less than its critical thickness with respect to the top of said first layer, and
   a second layer of $Si_{1-x}Ge_x$ formed epitaxially on said first layer.

2. The layered structure of claim 1 wherein said over-shoot layer has a lattice spacing corresponding to a composition greater than x.

3. The layered structure of claim 1 wherein z is 0.05.

4. The layered structure of claim 1 wherein said over-shoot layer provides a greater than 90% relaxation for the second layer.

5. The layered structure of claim 1 wherein said over-shoot layer comprises $Si_{0.60}Ge_{0.40}$ and said third layer comprises $Si_{0.65}Ge_{0.35}$.

6. The layered structure of claim 1 wherein said third layer has a lattice constant greater than 4.956 Å.

7. The layered structure of claim 1 wherein said first layer, said over-shoot layer and said third layer serve to relax strain caused by lattice mismatch between a top surface of the second layer and the underlying single crystalline substrate.

8. The layered structure of claim 1 wherein said first layer, said over-shoot layer and said third layer have a combine thickness from 0.2 to 5 µm.

9. The layered structure of claim 1 further comprising a layer of undoped epitaxial Si located on said second layer, a undoped epitaxial $Si_{1-x}Ge_x$ located on said undoped epitaxial Si, a layer of epitaxial Ge located on said undoped $Si_{1-x}Ge_x$ layer, wherein said layer of epitaxial Ge is under compressive strain and has a thickness less than its critical thickness with respect to the first layer, a layer of epitaxial $Si_{1-w}Ge_w$ located on said epitaxial Ge where the Ge fraction w is in the range from 0.5 to <1.0 and where w–x>0.2 whereby said epitaxial $Si_{1-w}Ge_w$ layer is under compressive strain and a epitaxial layer of $Si_{1-x}Ge_x$ located on said epitaxial $Si_{1-w}Ge_w$ layer.

10. The layered structure of claim 9 wherein an active device region is a buried composite channel structure made up of an epitaxial Ge channel of said epitaxial Ge layer and an epitaxial $Si_{1-w}Ge_w$ channel of said epitaxial $Si_{1-w}Ge_w$ layer having a higher compressive strain to provide a deeper quantum well or a higher barrier for better hole confinement as compared to a single layer channel device alone.

11. The layered structure of claim 9 wherein said epitaxial Ge layer is formed at temperatures where 3D growth of Ge films does not occur to generate interface roughness problems and at a temperature range from 275°–350° C. where 2D growth of Ge films does occur.

12. The layered structure of claim 9 wherein the Ge content w may be graded within said layer of epitaxial $Si_{1-w}Ge_w$ starting with a higher Ge content nearer said epitaxial Ge layer and grading down in Ge content towards the upper surface of said layer of epitaxial $Si_{1-w}Ge_w$.

13. The layered structure of claim 9 wherein a spacer region comprises said undoped epitaxial Si and said undoped $Si_{1-x}Ge_x$ layer.

14. The layered structure of claim 9 wherein said undoped epitaxial Si layer is under tensile strain and is commensurate having a thickness below its critical thickness.

15. The layered structure of claim 9 wherein said second layer of $Si_{1-x}Ge_x$ is a p-doped $Si_{1-x}Ge_x$ layer formed below a channel region of said epitaxial Ge layer and said epitaxial $Si_{1-w}Ge_w$ layer and separated therefrom by said undoped epitaxial Si layer and said layer of undoped $Si_{1-x}Ge_x$, said second layer having a thickness in the range from 1 to 20 nm and having an electrically active donor dose in the range from 1 to $3 \times 10^{12}$ cm$^{-2}$.

* * * * *